US006072411A

United States Patent [19]

Yoshioka

[11] Patent Number: 6,072,411

[45] Date of Patent: Jun. 6, 2000

[54] METHOD AND APPARATUS FOR MESSAGE CORRECTION

[75] Inventor: Kenji Yoshioka, Tokyo, Japan

[73] Assignee: NEC Corporation, Tokyo, Japan

[21] Appl. No.: 08/921,692

[22] Filed: Sep. 2, 1997

[30] Foreign Application Priority Data

Sep. 2, 1996 [JP] Japan .................................... 8-232226

[51] Int. Cl.[7] ...................................................... H03M 7/00

[52] U.S. Cl. ................................................................ 341/94

[58] Field of Search ......................... 341/94; 340/825.44, 340/311.1; 714/822

[56] References Cited

U.S. PATENT DOCUMENTS

| | | | |
|---|---|---|---|
| 4,956,641 | 9/1990 | Matai et al. | 340/825.44 |
| 5,329,598 | 7/1994 | Geist . | |

FOREIGN PATENT DOCUMENTS

| | | |
|---|---|---|
| 0 193 188 | 9/1986 | European Pat. Off. . |
| 61-198931 | 9/1986 | Japan . |
| 62-189826 | 8/1987 | Japan . |
| 63-187742 | 8/1988 | Japan . |
| 5-244065 | 9/1993 | Japan . |
| 7-303137 | 11/1995 | Japan . |
| 8-19026 | 1/1996 | Japan . |
| 8-88698 | 4/1996 | Japan . |
| 2 136 248A | 9/1984 | United Kingdom . |
| WO 86/04476 | 7/1986 | WIPO . |

OTHER PUBLICATIONS

British Search Report, Dec. 9, 1997.

Japanese Office Action dated Oct. 27, 1998, with partial translation.

*Primary Examiner*—Brian Young
*Attorney, Agent, or Firm*—McGinn & Gibb, P.C.

[57] ABSTRACT

A method and receiver for correcting a received message includes a character converter for converting received data into a character string, and for converting the character string into characters, when a predetermined character in the character string is recognized by the character converter. A message corrector corrects a message formed by the characters when an error is included in the message.

33 Claims, 15 Drawing Sheets

FIG.15

CHARACTER (second digit)

| | | 2 SECOND DIGIT | | | | | | | | | |
|---|---|---|---|---|---|---|---|---|---|---|---|
| | | 1 | 2 | 3 | 4 | 5 | 6 | 7 | 8 | 9 | 0 |
| 1 FIRST DIGIT | 1 | ア (A) | イ (I) | ウ (U) | エ (E) | オ (O) | A | B | C | D | E |
| | 2 | カ (KA) | キ (KI) | ク (KU) | ケ (KE) | コ (KO) | F | G | H | I | J |
| | 3 | サ (SA) | シ (SI) | ス (SU) | セ (SE) | ソ (SO) | K | L | M | N | O |
| | 4 | タ TA | チ CHI | ツ TSU | テ TE | ト (MA) | P | Q | R | W | T |
| | 5 | ナ (NA) | ニ NI | ヌ NU | ネ NE | ノ (NO) | U | V | W | X | Y |
| | 6 | ハ (HA) | ヒ HI | フ HU | ヘ HE | ホ HO | Z | ? | ! | — | / |
| | 7 | マ (MA) | ミ MI | ム MU | メ ME | モ MO | ¥ | & | | | |
| | 8 | ヤ (YA) | ( | ユ (YU) | ) | ヨ YO | * | # | SP | SP | SP |
| | 9 | ラ (RA) | リ RI | ル RU | レ RE | ロ RO | 1 | 2 | 3 | 4 | 5 |
| | 0 | ワ (WA) | ヲ WO | ン N | ゛ | ゜ | 6 | 7 | 8 | 9 | 0 |

CHARACTER (first digit)

METHOD AND APPARATUS FOR MESSAGE CORRECTION

DESCRIPTION

BACKGROUND OF THE INVENTION

1. Field of the Invention

The present invention relates to a method and apparatus for message correction, and more particularly to a receiver and method for correcting received message information.

2. Description of the Related Art

When transmitting a predetermined language character (e.g., a matrix character which may be a kana character (a Japanese language character) or the like) as message information to a receiver, a caller inputs a character conversion code for a character (e.g., a kana character) and then inputs the numerical data corresponding to the specific kana character, to transmit the character. A two-digit character is used for one character according to the character conversion matrix shown in FIG. 15. When there is a character conversion code in a received message, the receiver converts the numerical data into characters according to a character conversion matrix, and displays the message information on a display section in the form of characters.

Such a receiver normally cannot display a message if an error occurs in the transmission path. Therefore, a conventional receiver having a message correction mechanism is provided within a memory (i.e., a random access memory (RAM)) storing many pieces of message information relating to common errors that are previously input. Such a system is shown by the individual calling system disclosed in Japanese Patent Application Laid-Open No. 244065/1993. The receiver decides whether an error occurs in the received message data according to BCH (e.g., Bose Chaudhuri Hocquenghem) parity bits. The BCH parity bit may be an error correct bit of, for example, ten bits. It is used to check for errors. It can detect one error bit generated during the communication process, and it is sent as a portion of the message data.

When the presence or possibility of an error exists, the conventional receiver searches the information coinciding with, or similar to, the received message information within the RAM, and displays the searched information together with the received message information. The above structure also confirms whether there is an error in a received message. The conventional system confirms the error according to the BCH parity bit in the received message data. If the received message data has more than two errors, the conventional system compares it with predetermined message data in the RAM.

More specifically, in Japanese Patent Application Laid-Open No. 187742/1988, a newly-received message A is compared with a message B previously stored in memory. When certain conditions are satisfied (e.g., such as the number of characters of message A equaling that of message B, the characters (excluding the characters detected as errors by BCH parity bits) in message A coinciding with those in message B, and the number of mismatched characters in messages A and B being equal to or less than a predetermined rate of all characters), then message A is detected as a re-received message (i.e., a duplicate) of message B. Further, a character detected as an error in either of messages A or B is replaced with a character not detected as an error, thereby to obtain a correct message.

A radio selective-calling receiver with a display function is disclosed in Japanese Patent Application Laid-Open No. 198931/1986. In such a system, a received message is error-checked by an arithmetic logic unit (ALU), and is temporarily stored in a sub-storing section in the RAM. The characters in the temporarily stored message are compared one by one with the characters in messages previously stored in the main storing section in the RAM. When all pairs of characters free from error are identical, characters with errors in the messages in the main storing section are corrected, thereby to obtain a message with less errors. Once duplicate messages are found in the RAM, the method used to correct the errors is similar to the previously-mentioned prior art reference (e.g., Japanese Patent Application Laid-Open No. 187742/1988). Specifically, this system confirms the error with comparing a received message with a message previously stored in the RAM.

A problem arises in Japanese Patent Application Laid-Open No. 244065/1993, in that a large amount of information must be input previously into the RAM, so that many different types of errors can be corrected. However, regardless of the amount of corrective information input to the RAM, all errors cannot corrected because it is impossible to input all possible error patterns in the RAM.

In Japanese Patent Application Laid-Open No. 187742/1988, a problem occurs when the same error exists in both messages A and B because the portions cannot be replaced with each other.

Additionally, in Japanese Patent Application Laid-Open No. 198931/1986, a problem occurs when the error check portion of a received message contains the same errors as that of a message previously stored in the main storing section in a RAM. In such a case, it is impossible to correct the error portion of the message in the main storing section.

Moreover, the above conventional systems only correct errors that occur in the communication route. No system corrects errors due to an incorrect input by a caller. For example, when a caller forgets to input a character conversion code or confuses the input of the data, a correct character conversion cannot be performed. Therefore, a nonsense message may be transmitted which does not include the contents to be transmitted by the caller.

FIGS. 12(*a*), 12(*b*), 12(*d*) and 12(*e*) and 13(*a*), 13(*b*), 13(*e*), and 13(*f*) illustrate some incorrect inputs. For example, FIG. 12(*a*) shows when a caller neglects to input a character conversion code. In such a case, the character is not converted into a character but it is directly displayed (e.g., see FIG. 12(*b*)).

FIGS. 12(*d*) and 13(*a*) show when the numerical data input after a character conversion code includes one extra character or is missing a character, and FIG. 13(*e*) shows when the numerical data after a character conversion code is duplicated.

Regardless, because every two characters are converted into characters according to a character conversion matrix, the splitting of one character could occur, and a nonsense message could be generated (e.g., see FIG. 12(*e*) and FIGS. 13(*b*) and 13(*f*)).

SUMMARY OF THE INVENTION

In view of the foregoing problems of the conventional systems and methods, an object of the present invention is to provide a method and apparatus (e.g., preferably a receiver) for correcting an error included in received message information due to an incorrect input by a caller, and for creating more exact message information.

Another object of the present invention is to provide a receiver having a simple structure and for estimating a more exact message. The present invention also can correct transmission-type errors, but for brevity the description below is limited to reception-type errors.

To achieve the above objects, in a first aspect of the present invention, a method and apparatus include a character converter for converting binary data into characters, a predetermined language character (e.g., a matrix character which for purposes of example only is a kana character as described below) conversion code identifier for identifying a predetermined language character conversion code, a first search device for searching whether the number of characters after the character conversion code is odd or even, and/or a second search device for searching a portion in which the same characters continue, and a character eliminator for deleting a specific character detected by one of the first and second search devices.

An apparatus (e.g., receiver) of the present invention first converts a received message into characters and decides whether a predetermined language character (e.g., a kana character) conversion code is included.

When the receiver judges that no character conversion code is included, the receiver directly displays the non-predetermined language characters on a liquid crystal display (LCD) or similar display. Thereafter, when the message correction operation is started, the receiver converts the characters displayed on the LCD into predetermined language characters and displays them on the LCD again. Thus, when the receiver judges that a character conversion code is included, the receiver converts the characters into predetermined language characters to display them on the LCD. Thereafter, when the message correction is started, the receiver deletes one character immediately after the character conversion code and converts the characters into predetermined language characters to display them on the LCD.

Moreover, when it is judged that a character conversion code is included, the invention deletes one character from a portion of the message in which the same characters continue after the character conversion code, converts the characters into predetermined language characters, and displays them on the LCD.

Furthermore, when it is judged that a character conversion code is included, the invention performs a character conversion from the end of the character string and displays the converted characters on the LCD.

With the unique and unobvious structure and method steps of the present invention, an error included in received message information due to incorrect input by a caller or the like, is reliably corrected, and thus more exact message information is created. Hence, the chance of a nonsense (erroneous) message being created is minimized, if not entirely prevented.

Further, the inventive apparatus has a simple structure, for allowing the user to estimate a more exact message.

BRIEF DESCRIPTION OF THE DRAWINGS

The foregoing and other objects, aspects and advantages will be better understood from the following detailed description of the preferred embodiments of the invention with reference to the drawings, in which:

FIG. 15 is a predetermined language character conversion matrix.

DETAILED DESCRIPTION OF PREFERRED EMBODIMENTS OF THE INVENTION

Figure 1:
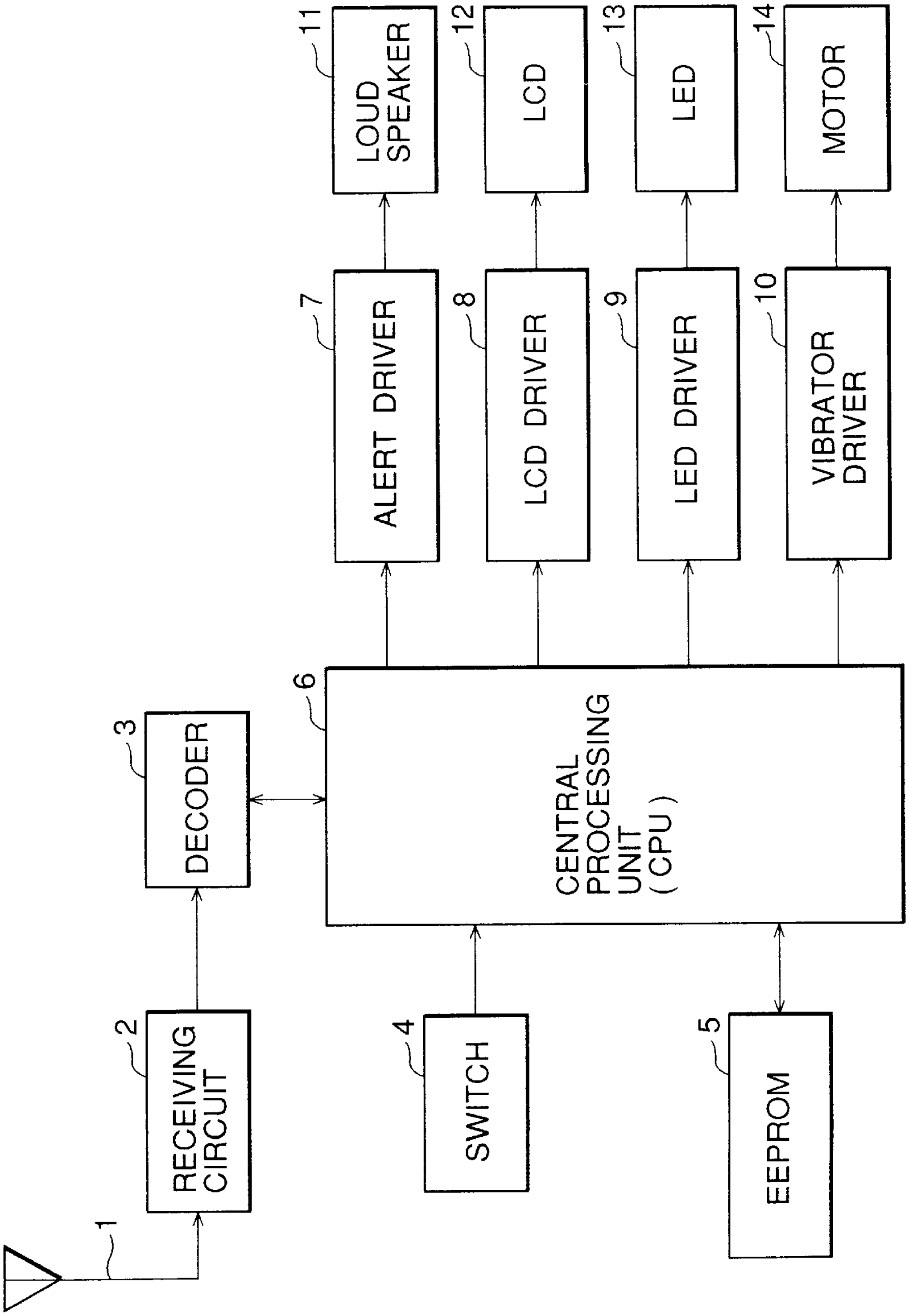
FIG. 1 is a functional block diagram of a radio selective-calling receiver according to the present invention.

Referring now to the drawings, and more particularly to FIG. 1, a receiver of a first embodiment of the invention, is illustrated. In a preferred implementation, the radio selective-calling receiver is employed as a pocket pager or "beeper".

Figure 11:
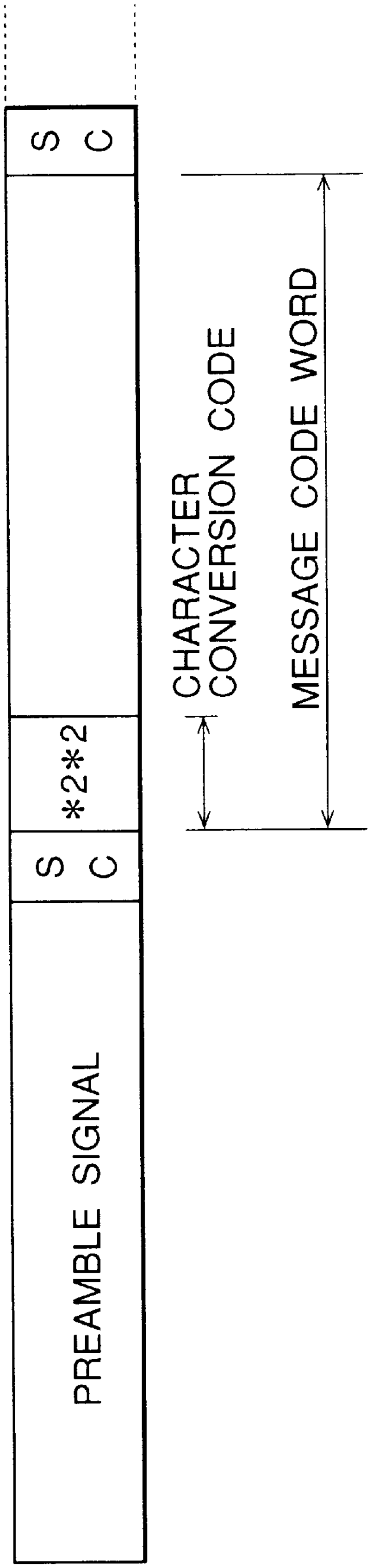
FIG. 11 is a schematic illustration showing the format of a received signal for the present invention.
Figure 12A:
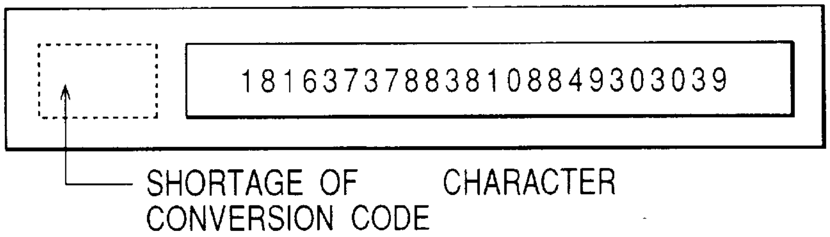
FIGS. 12(*a*)–12(*g*) are illustrations showing incorrect inputs by a caller.
Figure 12B:
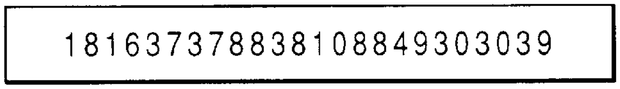
Figure 12C:
Figure 12D:
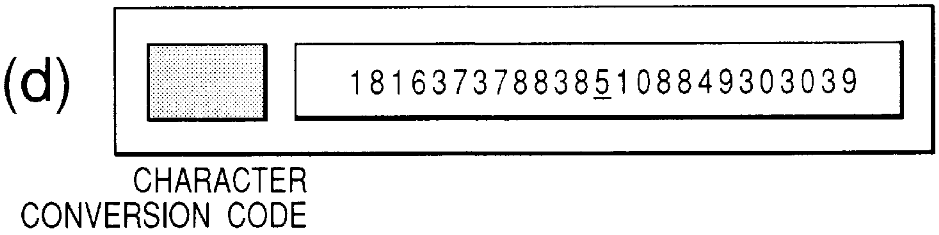
Figure 12E:
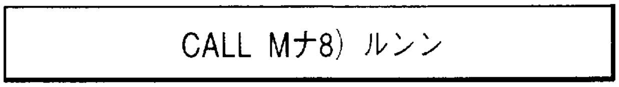
Figure 12F:
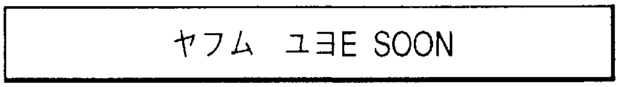
Figure 12G:
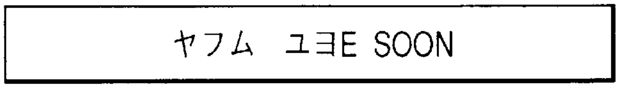
Figure 13A:
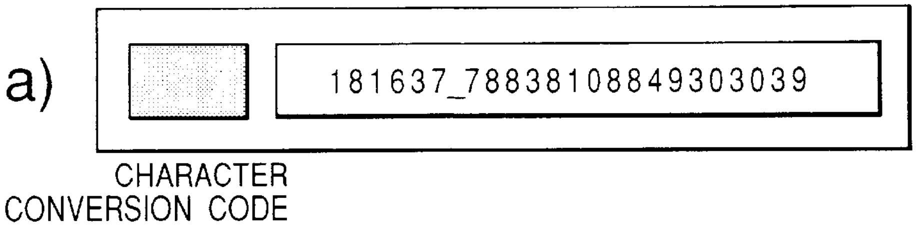
FIGS. 13(*a*) to 13(I) are illustrations showing further incorrect inputs by a caller.
Figure 13B:
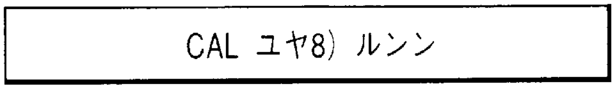
Figure 13C:
Figure 13D:
Figure 13E:
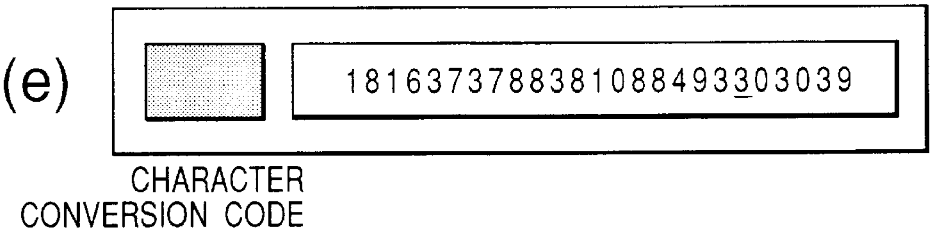
Figure 13F:
Figure 13G:
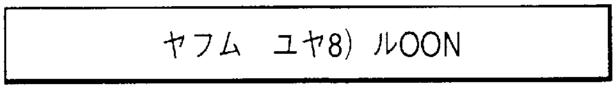
Figure 13H:
Figure 13I:
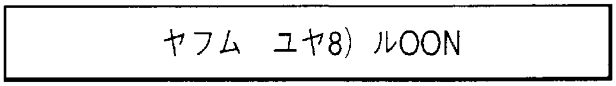

In FIG. 1, an incoming signal sent from a base station (not illustrated) is received by the receiver through an antenna 1. The receiver receives message data according to, for example, the signal format shown in FIG. 11. In the signal, a character conversion code (e.g., *2*2) including two characters, is present at the beginning of a message code word.

The signal is amplified and demodulated by a receiving circuit 2, and is output to a decoder 3 as a waveform-shaped (e.g., processed) digital signal.

When the signal is input, the decoder 3 collates (searches) for its own unique identification code (e.g., the selective-calling number) stored in an electrically erasable programmable read only memory (EEPROM) 5, with the selective-calling number included in the received signal.

When the decoder 3 receives its own identification code (e.g., the selective-calling numbers coincide with each other), the decoder 3 transmits the message data following the selective-calling number to a central processing unit (CPU) 6.

The CPU 6 transmits a control signal to an alert driver 7, an LCD driver 8, a light emitting diode ("LED") driver 9, and vibrator driver 10 according to a communication announcement device(s) 11–14 previously specified by a switch 4 which is operated by the user. Thereafter, the CPU 6 operates a loudspeaker 11, LCD 12, LED 13, and motor 14 as corresponding announcement (alarm) devices. It is noted that while the system is configured to select only one announcement/alarm device at a time, the system could be modified easily to select more than one alarm announcement/device at a time.

Figure 2:
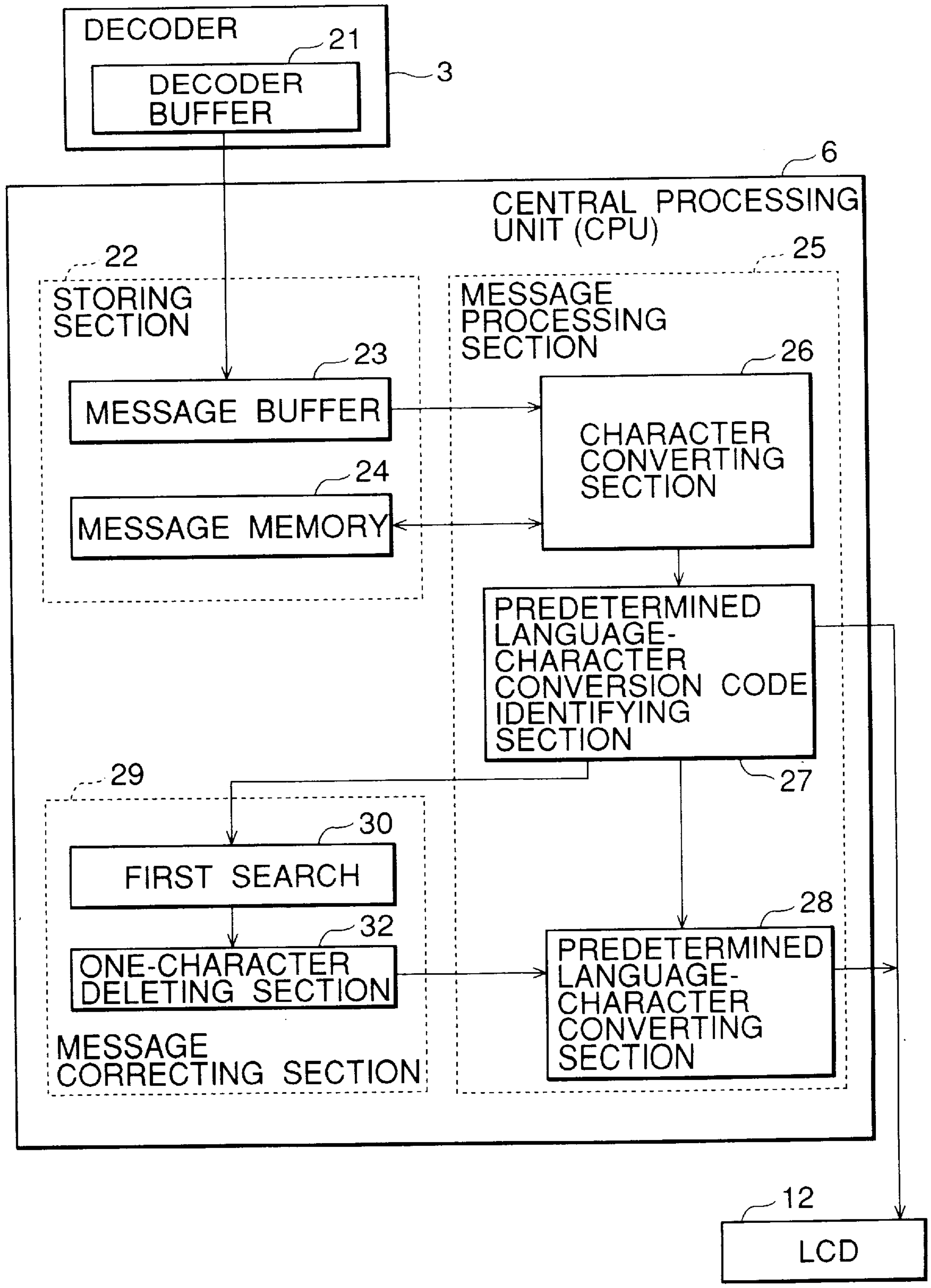
FIG. 2 is a functional block diagram of a first embodiment of a central processing unit (CPU) of the radio selective-calling receiver of the present invention shown in FIG. 1.

FIG. 2 is a block diagram of a first embodiment of the CPU 6 for message processing. In FIG. 2, the same components as that of the radio selective-calling receiver shown in FIG. 1 are provided with the same reference numbers to aid understanding.

In FIG. 2, the CPU 6 includes a storing section 22 for storing a received message, a message processing section 25 for converting the received message data into predetermined language (e.g., such as kana, Roman alphabet characters or Latin numbers) characters, and a message correcting section 29 for correcting a message that includes an error.

In the storing section 22, a message buffer 23 temporarily stores an incoming signal output from a decoder buffer 21 in the decoder 3 as binary data, and a message memory 24 stores message data converted into characters in a character converting section 26 in the message processing section 25.

In the message processing section 25, the character converting section 26 converts the binary data output from the message buffer 23 into the two-digit characters found in a matrix or the like (e.g., the matrix of FIG. 15), a character conversion code identifying section 27 identifies whether characters (character conversion code) showing a character message are included. A character converting section 28 converts the two-digit characters converted into predetermined language characters.

Moreover, in the message correcting section 29, a first search unit 30 searches whether the number of characters (digits) after a character conversion code is odd or even (e.g., counts the characters to determine whether an odd or an even number is present), and a one-character deleting section 32 deletes one character detected by the first search unit 30. The importance of the indication of an odd number or even number of characters depends on the matrix employed. For example, in the present embodiment, an odd number indicates a missing character, whereas an even number indicates that there are no missing characters. Obviously, a different scheme could be employed.

In the above structure, received binary data is sent from the decoder buffer 21 in the decoder 3 to the message buffer 23 in the storing section 22. Then, the data is converted into characters by the character converting section 26, and is stored in the message memory 24. Thereafter, the character conversion code identifying section 27 identifies whether the data includes a character conversion code.

When it is judged by section 27 that a character conversion code is included in the data, an operation by the first search unit 30 is executed, and, according to the result, one character detected by the first search is deleted by the one-character deleting section 32. Specifically, this character is deleted, so that the total number of characters is even (and thus the result is easier for the operator to interpret and reliably estimate).

After the character is deleted (or when section 27 judges that no character conversion code is included in the received message data), the data is converted into predetermined language characters (e.g., matrix characters such as kana characters in the present embodiment). Thus, the data is converted into characters by the character converting section 28, and a corrected message is displayed on the LCD 12.

Moreover, when it is judged by section 27 that a character conversion code is included in the data and no error is detected in the message, the message is directly displayed on the LCD 12. Once again, the user determines that no errors are present by simply reading the nonsense message and making such a determination.

Figure 3:
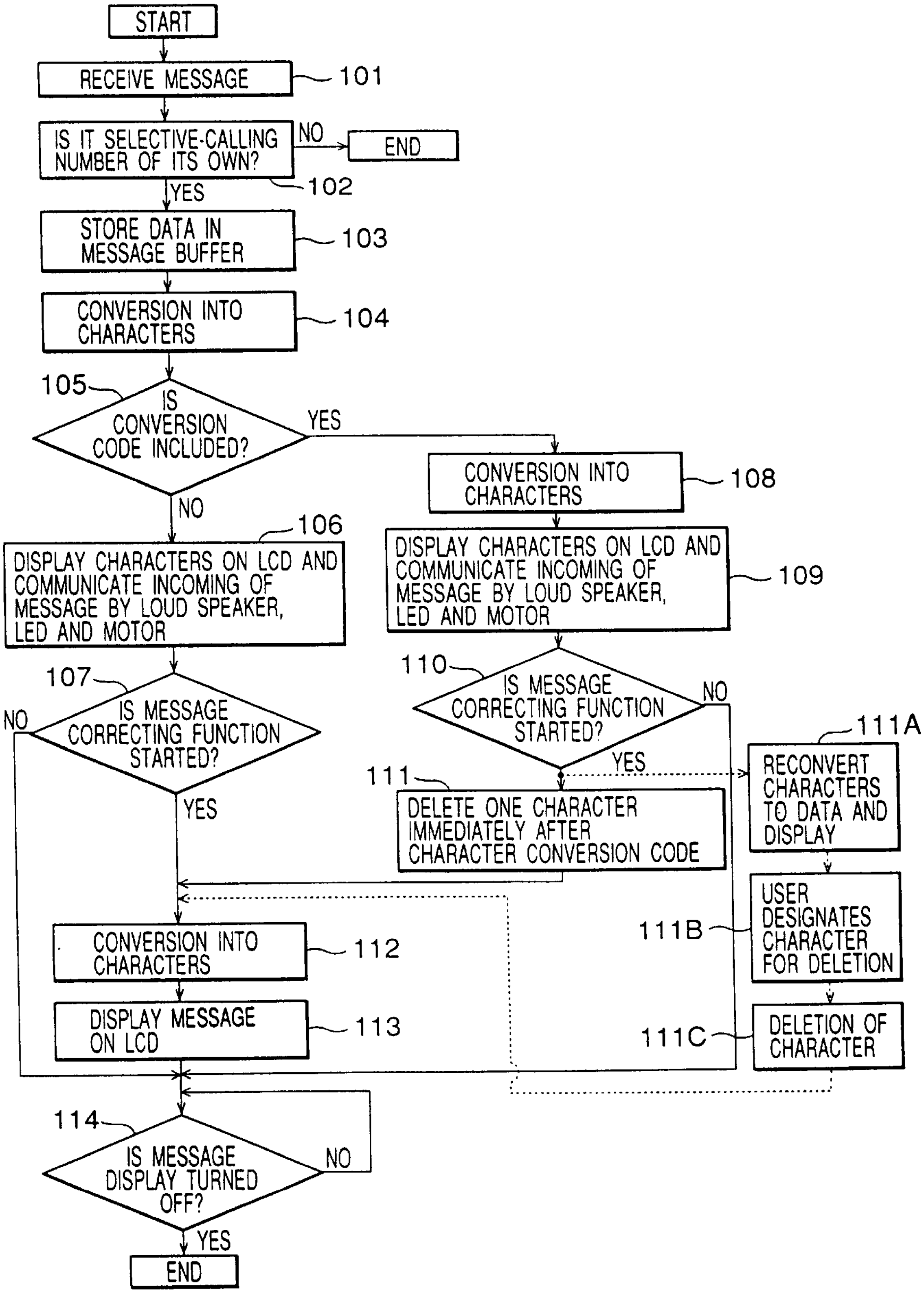
FIG. 3 is a flowchart showing the operation of the radio selective-calling receiver incorporating a CPU according to the first embodiment of the present invention shown in FIG. 2.

The operations of the radio selective-calling receiver shown in FIGS. 1 and 2 are described below with reference to the flowchart in FIG. 3. FIG. 3 shows the operation of the radio selective-calling receiver for correcting the incorrect inputs by a caller shown in FIGS. 12(*a*) and 12(*d*) and FIG. 13(*a*). In FIG. 12(*d*), the numeral "5" represents an erroneous inputted character.

In FIG. 3, an incoming signal is sent from a base station (not illustrated) and is received by the receiving circuit 2 through the antenna 1, amplified and demodulated by the receiving circuit 2, and input to the decoder 3 as a waveform-shaped digital signal (step 101).

When the signal is input, the decoder 3 checks the received input signal to determine whether the selective-calling number in the received input signal matches the decoder's own identification signal (e.g., a selective-calling number) stored in an EEPROM 5 (step 102).

When the selective-calling number that is broadcast coincides with the receiver's selective-calling number, the incoming signal output from the decoder buffer 21 in the decoder 3 is temporarily stored in the message buffer 23 in the CPU 6 as binary data (step 103).

In step 104, the data stored in the message buffer 21 is converted into characters (bit-by-bit) by the character converting section 26.

Thereafter, in step 105, the character conversion code identifying section 27 judges whether a character conversion code is included in the characters. When it is judged that a character conversion code is included in the characters (e.g., a YES" in step 105), the characters subsequent to (e.g., positioned after) the character conversion code are converted into characters (e.g., predetermined language characters such as kana characters or the like) according to a conversion matrix shown, for example, in FIG. 15 (step 108). The converted characters are displayed on the LCD 12 as shown in FIGS. 12(*e*) and 13(*b*).

Simultaneously, in step 109, an indication that the signal is being received is communicated by the loudspeaker 11, LED 13, and motor 14. The user starts a message correcting function by operating a switch while the message is displayed on the LCD 12 in step 109 (step 110), and one character immediately after the character conversion code is deleted (step 111).

Alternatively to the operation of step 111 being performed by the device deleting one character immediately after the character conversion code, the branch of the flowchart including steps 111A–111C may be followed.

Specifically, after a "YES" is judged in step 110, characters may be reconverted to data and displayed as shown in step 111A. Thereafter, in step 111B, the user views the message and selectively designates a character for deletion. Then, in step 111C, the designated character is deleted by actuating the device.

Thereafter, in step 112, character conversion is performed again, and a message is displayed on the LCD 12 as shown in FIG. 12(*f*) and FIG. 13(*c*), respectively (step 113). The characters are displayed until the user turns off the switch 4 (step 114).

When it is judged that no character conversion code is included in step 105 (e.g., a "NO"), in step 106 the characters converted in step 104 are directly displayed on the LCD 12 as shown in FIG. 12(*b*).

Simultaneously, in step 106, an indication that a signal has been received is announced to the user by the loudspeaker 11, LED 13, and/or motor 14.

When the user starts the message correction unit by operating a switch while characters are displayed on the LCD 12 in step 106, in step 107 the characters displayed on the LCD 12 are converted into characters according to the character conversion matrix shown in FIG. 15 (step 112), and are displayed on the LCD 12 again, as shown in FIG. 12(*c*) (step 113). The characters are displayed until the user turns off the switch 4 (step 114).

When the message correction means is not started through the switch operation by the user in step 107 (or 110), the state in step 106 or 109 is continued until the user clears the message (step 114).

The entire message is converted into characters with both step 108 and the character conversion step 112, according to the character conversion matrix shown in FIG. 15.

As described above, a user can estimate and obtain an exact message with high probability, according to the two messages shown in FIGS. 12(*e*) and 12(*f*).

Second Embodiment

Figure 4:
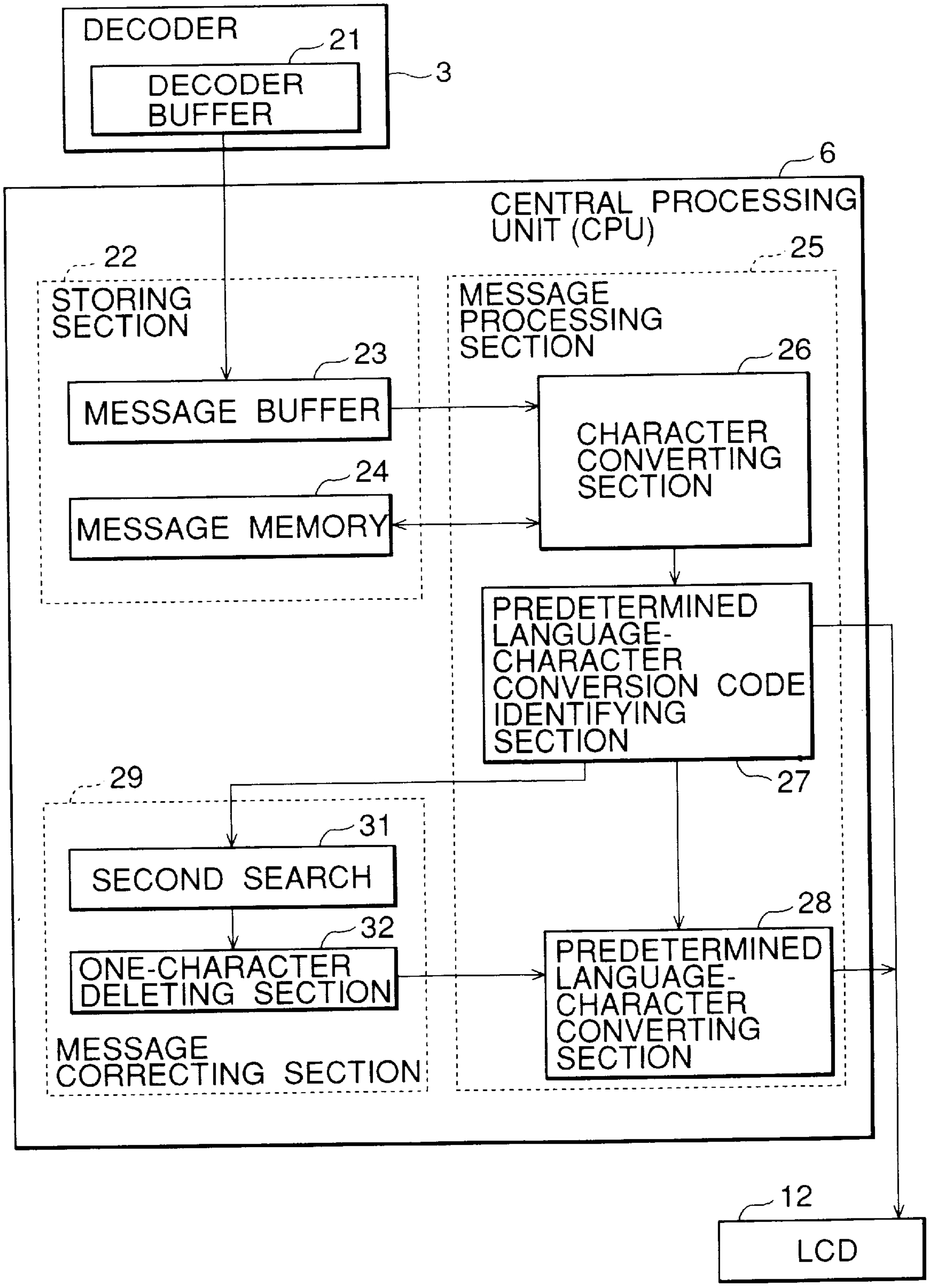
FIG. 4 is a functional block diagram of a second embodiment of the CPU according to the present invention.

A second embodiment of the present invention is described below with reference to FIG. 4 which is a block diagram of the CPU 6 in the receiver. In FIG. 4, the same components as that of the CPU 6 shown in FIG. 2 are given the same reference numbers for ease of understanding.

A key difference between the first embodiment and the second embodiment is that the radio selective-calling receiver of the second embodiment is provided with a second search unit 31 for searching a portion in which characters are repeated, instead of the first search unit 30 for searching whether the number of characters after the character conversion code shown in FIG. 2 is odd or even.

Thus, the second search unit 31 searches for repeated characters. Repeated characters do not indicate the presence of characters, but simply indicate a high probability of error. Such error may typically be caused by a user's erroneous input (e.g., continuous characters caused by the user depressing an input key too long or the like). Specifically, if the received message data has the character conversion code, the receiver (e.g., operator) can judge that the character following it is a character.

Figure 5:
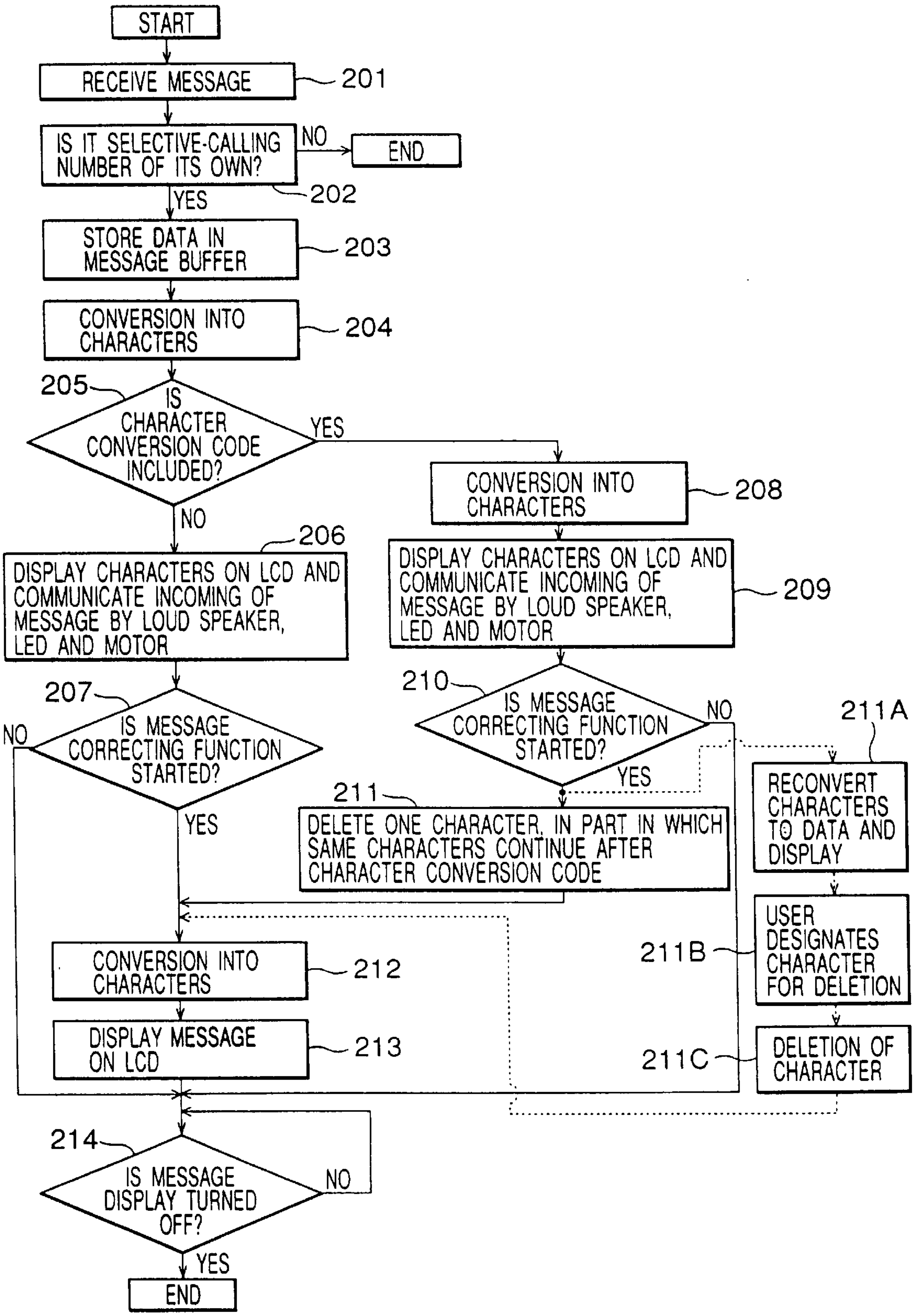
FIG. 5 is a flowchart showing the operation of the radio selective-calling receiver incorporating a CPU according to the second embodiment of the present invention shown in FIG. 4.

Operations of the radio selective-calling receiver shown in FIG. 4 are described below with reference to the flowchart in FIG. 5. FIG. 5 shows the operation of the radio selective-calling receiver for correcting the incorrect inputs by a caller shown in FIG. 12(*a*) and FIG. 13(*e*).

Turning to FIG. 5, in step 209, the message shown in FIG. 13(*f*) is displayed on the LCD 12.

In step 210, it is judged whether a user has started the message correction mechanism by operating a switch. Thus, the user operates the switch and starts a correcting function.

If "YES" in step 210, in step 211 one character is deleted from a portion in which the same characters after a character conversion code continue (e.g., are found/repeated. This "portion" is the two same continuous characters. The second embodiment according to the invention corrects the error by a user's erroneous duplicate inputs of the same input mechanism (e.g., "button", key, etc.). Thus, by deleting one character of the two same continuous characters, the receiver can display the correct message. By the same token, if the user meant to actuate the same button and thereby repeat characters, the switch is activated by the user a plurality of times to "guess" the meaning of the message.

If there are a plurality of a set of the same continuous characters, one character of the first set of the continuous characters is deleted. In step 213, converted characters are displayed. Thereafter, if the switch 4 is operated again, one character of the second set of the continuous characters is deleted. Such an operation may be continued.

Alternatively to the operation of step 211 being performed by the device deleting one character of the two same continuous characters, the branch of the flowchart of FIG. 5 including step 211A–211C may be followed.

Specifically, after a "YES" is judged in step 210, characters may be reconverted to data and displayed as shown in step 211A. Thereafter, in step 211B, the user views the message and designates a character for deletion. Then, in step 211C, the designated character is deleted by actuating the device.

Character conversion is performed again (step 212). In step 213, messages are displayed on the LCD 12 as shown in FIG. 13(*h*).

Because operations other than the above are the same as those of the radio selective-calling receiver shown in FIGS. 2 and 3, their description is omitted to avoid redundancy. Steps 201 to 210 and steps 212 to 214 shown in FIG. 5 respectively correspond to steps 101 to 110 and steps 112 to 114 shown in FIG. 3.

Thus, in the second embodiment, the radio selective-calling receiver includes the second search unit 31 for searching a portion in which characters are repeated. As mentioned above, repeated characters do not indicate the presence of characters, but simply indicate a high probability of error, typically caused by a user's erroneous input. Thus, if the received message data has the character conversion code, the receiver (e.g., operator) can judge that the character following it is a character, and a message can be deciphered ("guessed") easily and reliably by the operator.

Third Embodiment

A third embodiment of the present invention is described below with reference to FIG. 6 which illustrates a block diagram of the CPU 6 in the receiver of the third embodiment, particularly in a radio selective-calling receiver such as a pocket pager.

Figure 6:
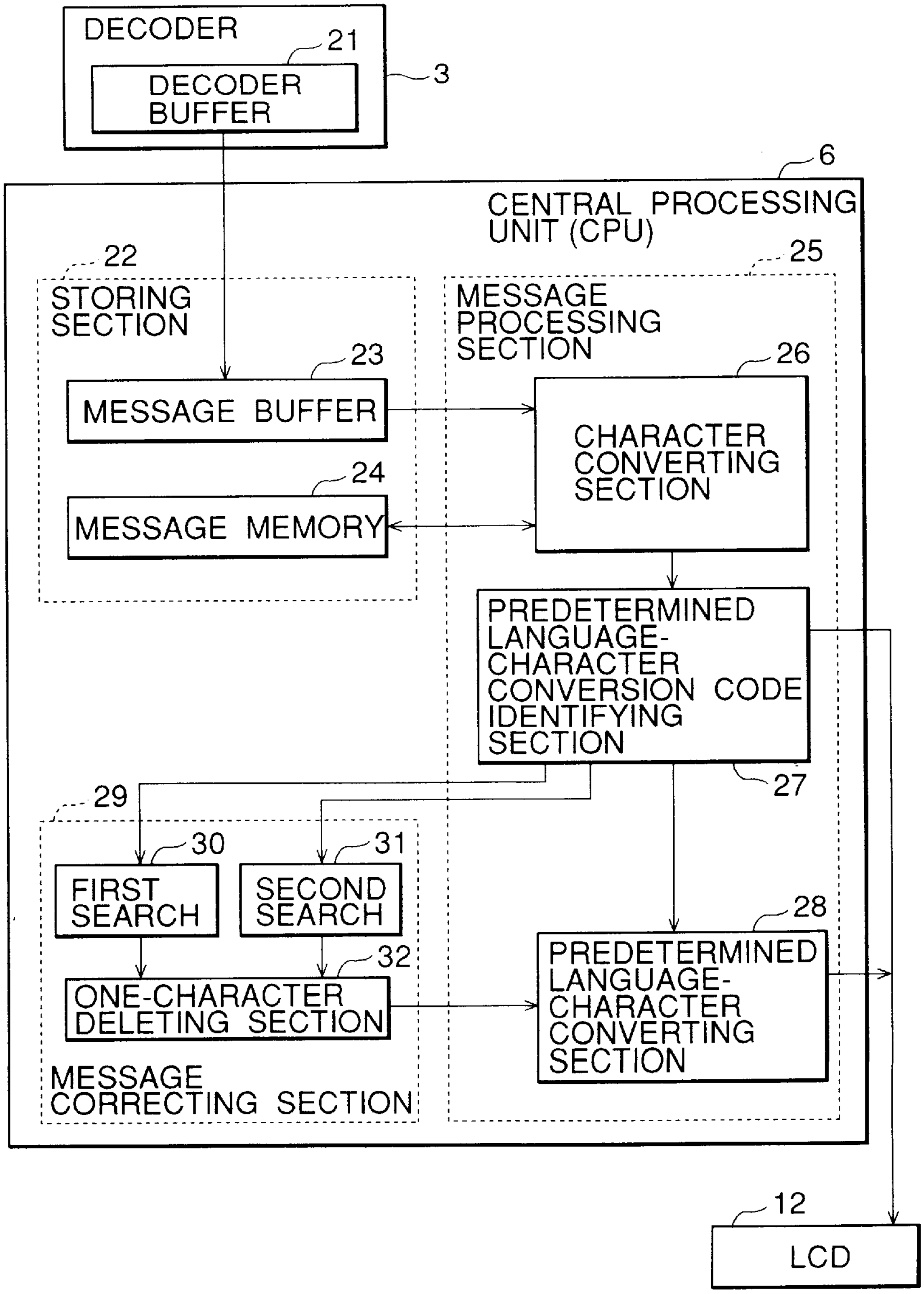
FIG. 6 is a functional block diagram of a third embodiment of the CPU according to the present invention.

In FIG. 6, the same components as that of the CPU 6 shown in FIGS. 2 and 4 are provided with the same reference numbers. The radio selective-calling receiver of the third embodiment is provided with both the first search unit 30 for searching whether the number of characters after the character conversion code is odd or even (e.g., shown in FIG. 2), and the second search unit 31 for searching a portion in which the same characters continue (e.g., are repeated), as shown in FIG. 4.

Figure 7:
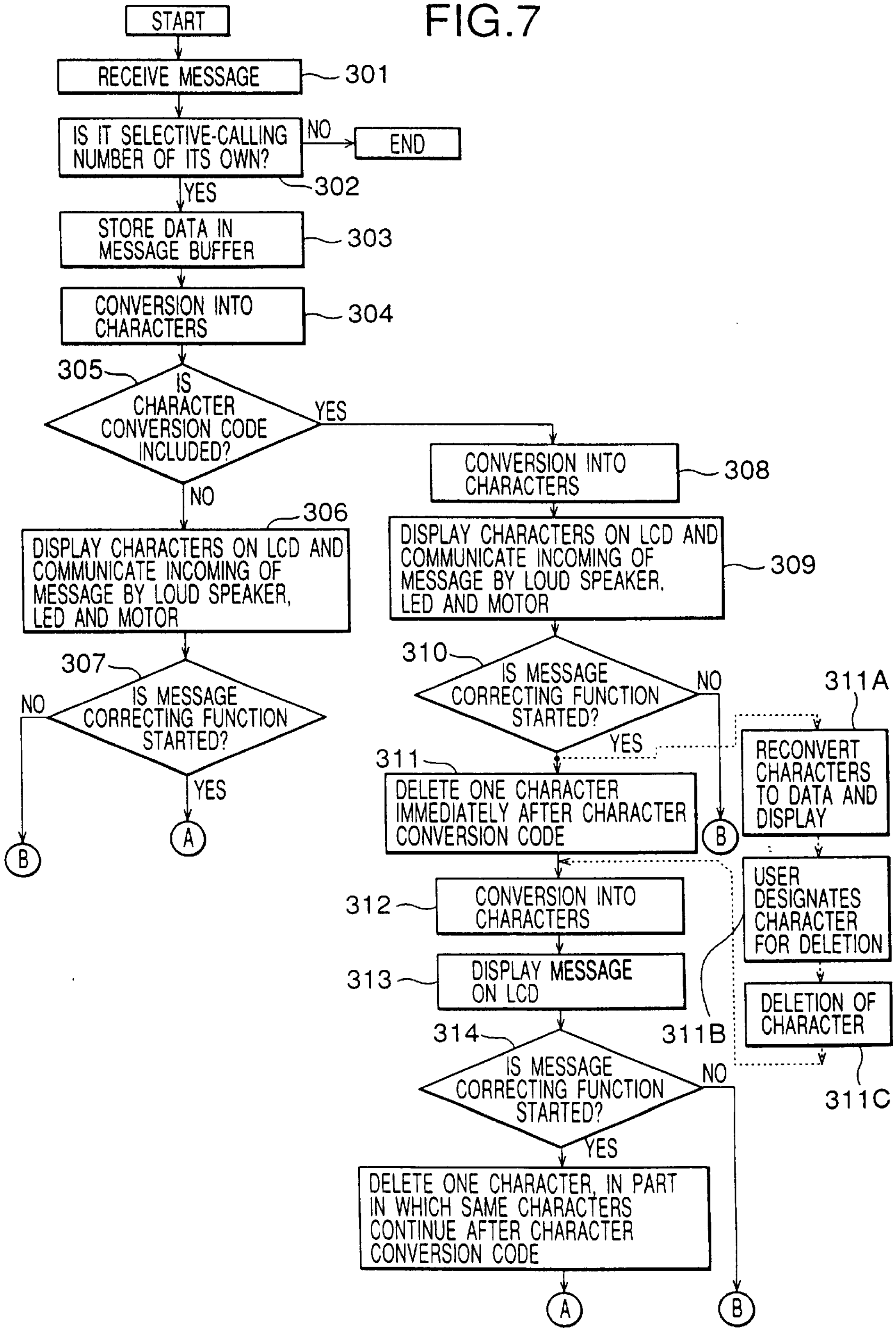
FIG. 7 is a flowchart showing the operation of the radio selective-calling receiver incorporating a CPU according to the third embodiment of the present invention.
Figure 8:
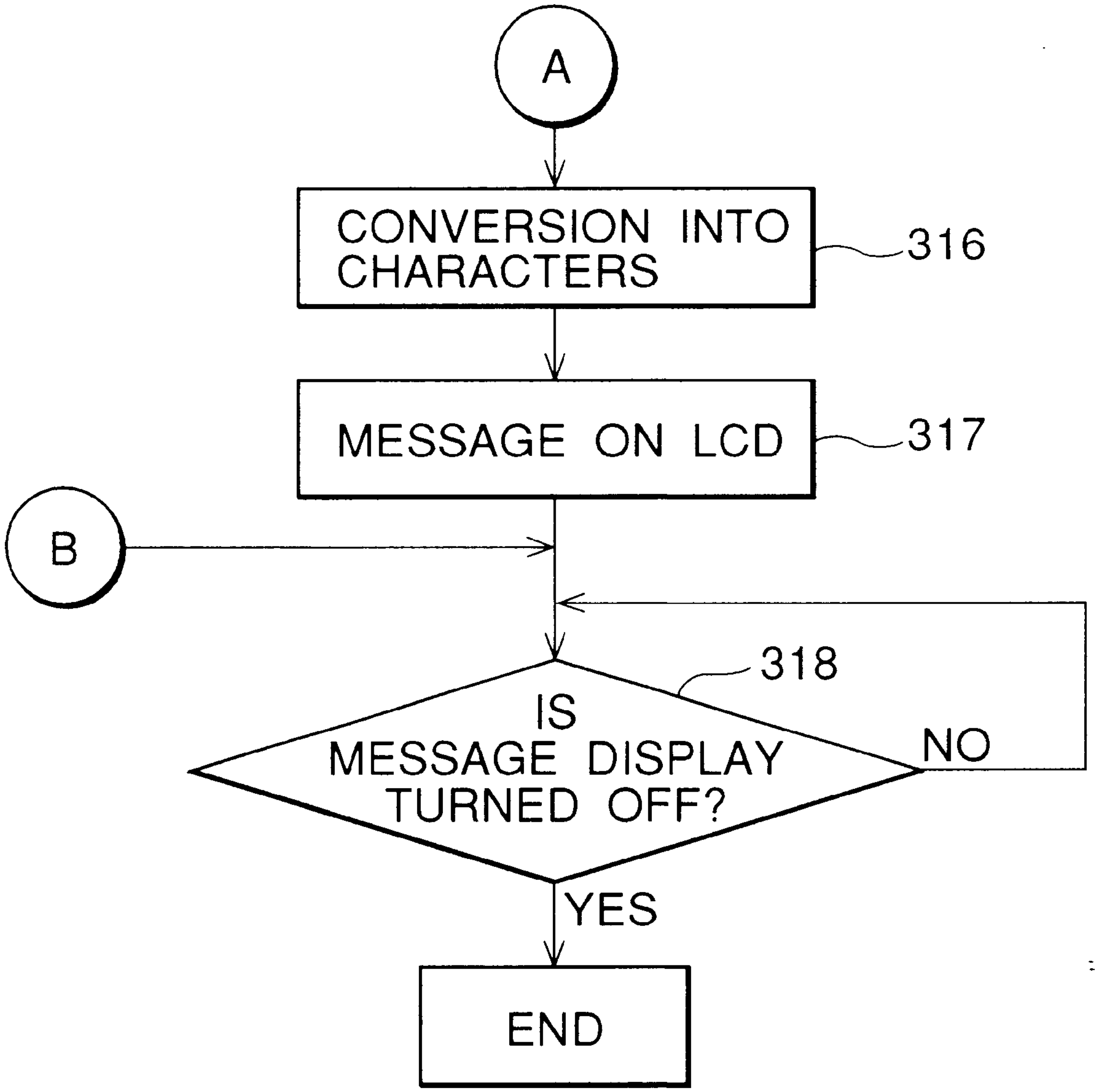
FIG. 8 is a further flowchart showing the operation of the radio selective-calling receiver incorporating the CPU according to the third embodiment of the present invention.

Operations of the radio selective-calling receiver shown in FIG. 6 are described below with reference to the flowcharts in FIGS. 7 and 8. FIGS. 7 and 8 show the operation of the radio selective-calling receiver for correcting the incorrect inputs by a caller shown in FIGS. 12(*a*) and 12(*d*) and FIGS. 13(*a*) and 13(*e*).

In FIG. 7, the message shown in FIG. 13(*f*) is displayed on the LCD 12 in step 309.

In step 310, it is judged whether a message correction operation has been started. When it is judged that a user has started the message correction mechanism by operating a switch 4 in step 310 (e.g., a "YES"), one character immediately after a character conversion code is deleted (step 311).

Alternatively to the operation of step 311 being performed by the device deleting one character immediately after the character conversion code, the branch of the flowchart of FIG. 7 including steps 311A–311C may be followed.

Specifically, after a "YES" is judged in step 310, characters may be reconverted to data and displayed as shown in step 311A. Thereafter, in step 311B, the user views the message and designates a character for deletion. Then, in step 311C, the designated character is deleted by actuating the device.

In step 312, character conversion is performed, and a message is displayed on the LCD 12 as shown in FIG. 13(*g*).

If the displayed message is nonsense, in step 314 the user starts the message correction mechanism again by operating the switch. After the correction mechanism is started, one character is deleted from a portion in which the same characters after the character conversion code continue (e.g., are repeated) (step 315). Thereafter, in step 316 character conversion is performed again (step 316), and a message is displayed on the LCD 12 as shown in FIG. 13(*h*) (step 317). The message is displayed on the LCD 12 until the user turns off the switch (step 318).

When the message correction mechanism is not started through the switch operation by the user in steps 307, 310, or 314, the state in step 306, 309, or 313 is continued until the user turns off the display (step 318). In step 306, the characters converted in step 304 are directly displayed on the LCD 12, as shown in FIG. 12(*b*) because no character conversion code is included in the received message.

Because operations other than the above are the same as those of the radio selective-calling receiver shown in FIG. 3, their description is omitted to avoid redundancy. Steps 301 to 310 shown in FIGS. 7 and 8 correspond to steps 101 to 110 shown in FIG. 3.

Thus, in the third embodiment, the radio selective-calling receiver includes the first and second search units 30, 31 for respectively searching for a character conversion code and for searching a portion in which characters are repeated. Thus, a message can be deciphered ("guessed") easily and reliably by the operator.

Fourth Embodiment

The receiver of the fourth embodiment of the present invention is described below with reference to FIG. 9 which illustrates a block diagram of the CPU 6 in the receiver of this embodiment, particularly in a radio selective-calling receiver such as a pocket pager.

Figure 9:
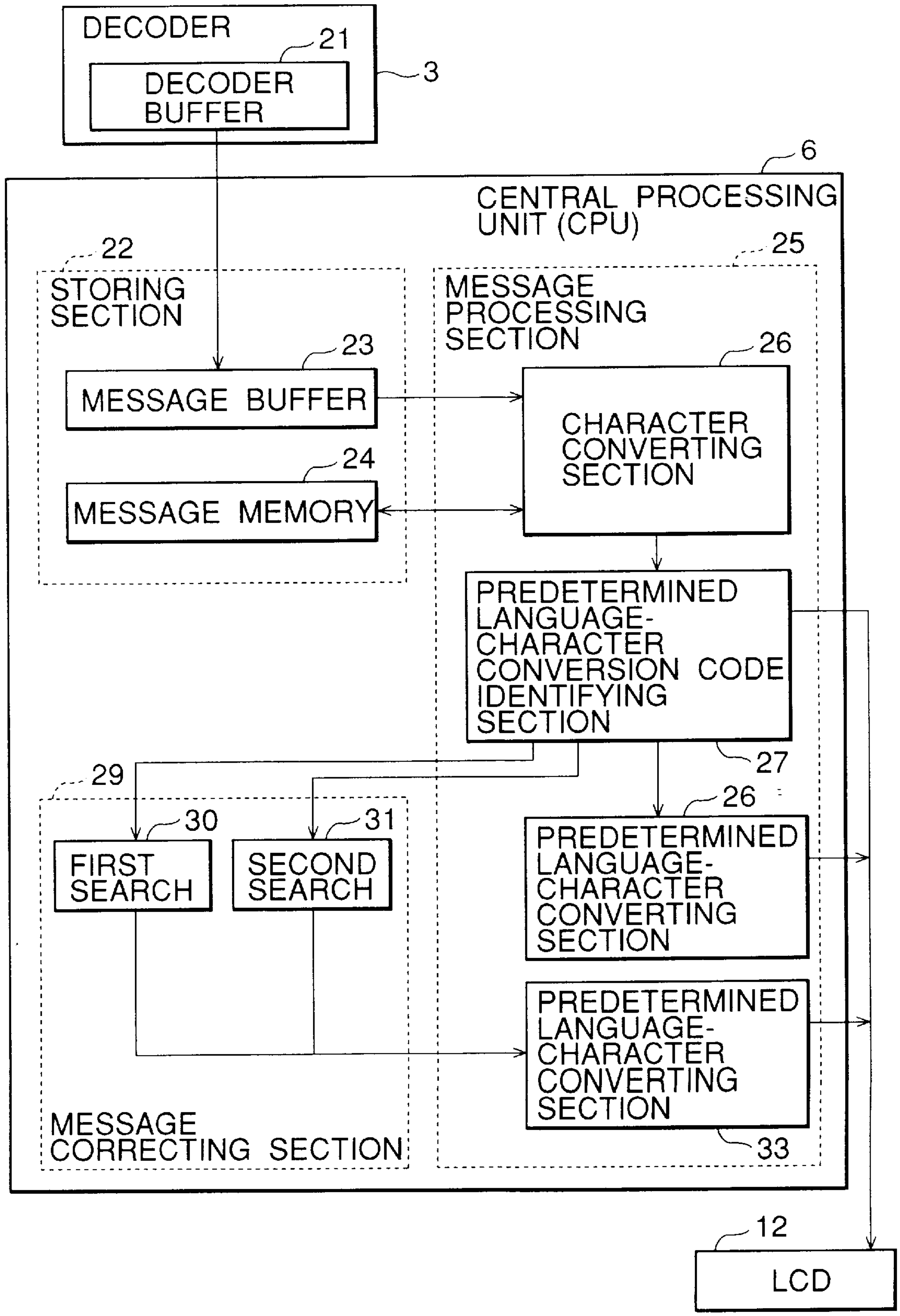
FIG. 9 is a functional block diagram of a fourth embodiment of the CPU according to the present invention.

In FIG. 9, the same components as that of the CPU 6 shown in FIG. 6 have the same reference numerals to aid understanding. The CPU 6 of the radio selective-calling receiver of the fourth embodiment has a structure in which the CPU 6 of the radio selective-calling receiver shown in FIG. 6 includes another character converting section 33 and converts a character string into characters (e.g., matrix characters such as kana characters or other predetermined language characters found in the matrix) by the character converting section 33, without deleting one character after performing operations by the first search unit 30 and the second search unit 31.

Further, the character converting section 28 converts characters in a character string into predetermined language characters (e.g., kana characters) one-by-one starting with the head of the character string according to a character conversion matrix. The character converting section 33 converts characters in a character string into kana characters one-by-one, starting with the end of the character string.

Figure 10:
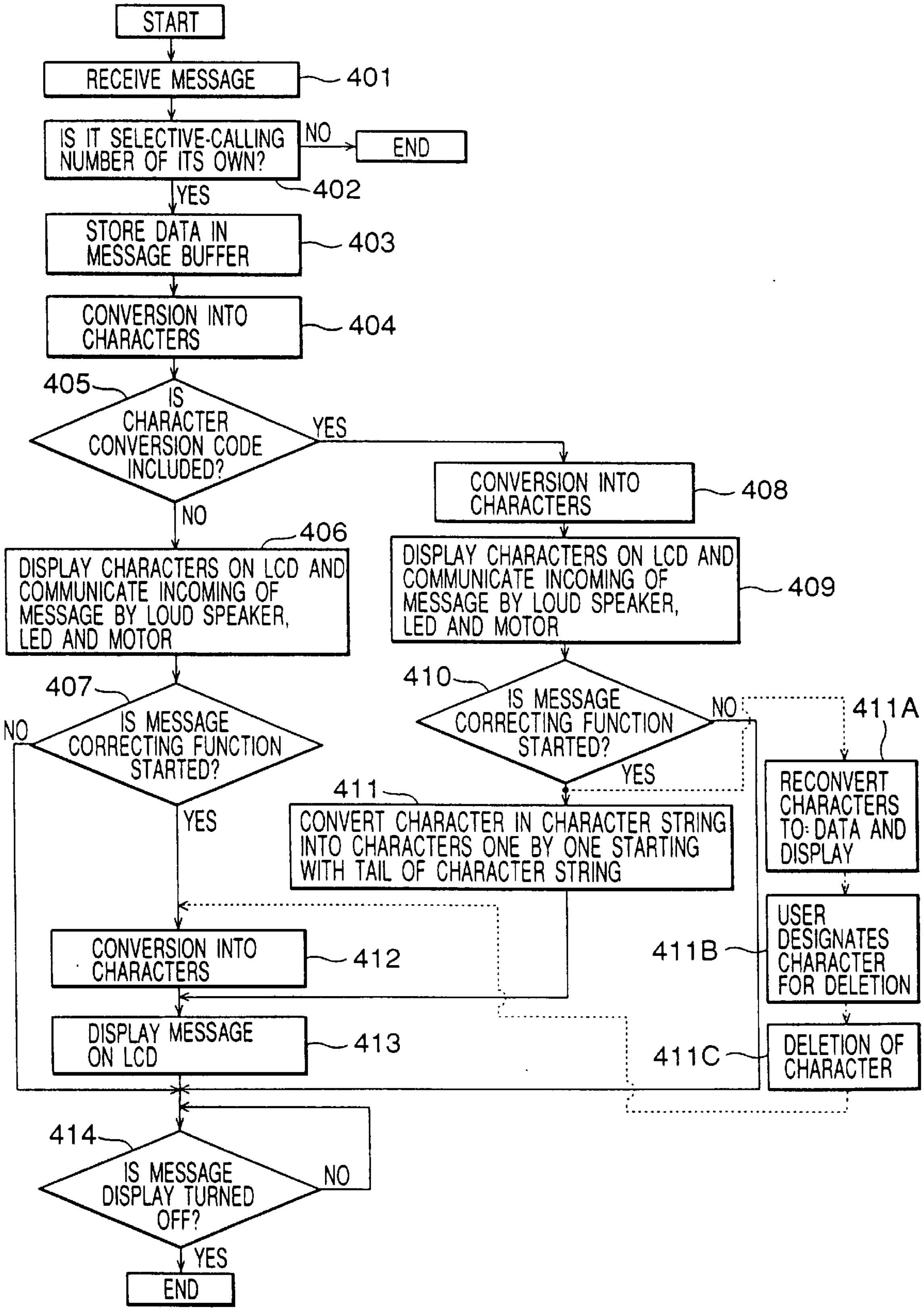
FIG. 10 is a flowchart showing operations of the radio selective-calling receiver incorporating a CPU according to the fourth embodiment of the present invention.

Operations of the radio selective-calling receiver shown in FIG. 9 are described below with reference to the flowchart in FIG. 10. FIG. 10 shows the operation of the radio selective-calling receiver for correcting incorrect inputs by a caller shown in FIGS. 12(*a*) and 12(*d*) and FIGS. 13(*a*) and 13(*e*).

In FIG. 10, the message shown in FIG. 12(*b*) is displayed on the LCD 12 in step 406. When a user starts the message correction operation by operating a switch in step 407, a character string is converted into predetermined language characters according to a character conversion matrix (e.g., such as kana characters found in the matrix of FIG. 15) (step 412). Thereafter, in step 413, the converted characters are displayed on the LCD 12 as shown in FIG. 12(*c*). The characters are displayed until the user turns off the switch in step 414.

In step 409, the message shown in FIG. 12(*e*), FIG. 13(*b*) or 13(*f*) is displayed on the LCD 12. When the user starts the message correction operation by operating the switch in step 410, characters in the character string are converted into predetermined language (matrix) characters starting with the end of the character string one-by-one (step 411).

Alternatively to the operation of step 411 being performed by the device starting with the end of the character string one-by-one, the branch of the flowchart of FIG. 10 including steps 411A–411C may be followed.

Specifically, after a "YES" is judged in step 410, characters may be reconverted to data and displayed as shown in step 411A. Thereafter, in step 411B, the user views the message and designates a character for deletion. Then, in step 411C, the designated character is deleted by actuating the device.

Then, the characters are displayed on the LCD 12 as shown in FIG. 12(*g*) or FIG. 13(*d*) or 13(*i*) (step 413). The characters are displayed until the user turns off the switch (step 414).

When the message correction means is not started through the switch operation by the user in step 407 or 410, the state in step 406 or 409 is continued until the user turns off the switch (step 414).

Because operations other than the above are the same as those of the radio selective-calling receiver shown in FIG. 3, their description is omitted to avoid redundancy. Steps 401 to 410 and steps 412 to 414 shown in FIG. 10 correspond to steps 101 to 110 and steps 112 to 114 shown in FIG. 3.

According to the radio selective-calling receiver of the fourth embodiment having the above structure, even if a caller forgets to input a character conversion code and thereby a character string is still displayed on an LCD, the character string still may be corrected to a more precise message by starting the message correction operation through the switch operation.

Moreover, if the numerical data input by a caller includes one extra (or one missing) character, the portion before the extra or missing character is displayed as a correct message, and the portion after the extra or missing character is displayed as a nonsense message before correction. Of course, depending upon the designer's constraints and requirements, the portion before the extra or missing character could be displayed as a nonsense message, and the portion after the extra or missing character could be displayed as a correct message.

By starting the message correction operation through the switch operation, the user can view selectively the messages before and after correction, and a more correct message may be obtained. Thus, the user judges whether a displayed message is correct, and can attempt to guess the meaning if it is not entirely correct. It is noted that the process could be performed automatically if the receiver were provided with appropriate functions (e.g., a dictionary function, a paragraph confirming function, etc.).

Furthermore, even if the caller duplicates the message, a message may be corrected to a more correct message by starting the message correction through the switch operation, so as to delete one character from a portion in which the same characters continue after the character conversion code.

Furthermore, even if the numerical data input by the caller includes one extra or missing character or the caller erroneously inputs the same numerical data twice consecutively, the portion before the extra or missing character is displayed as a correct message and the portion after the extra or missing character is displayed as a nonsense message. Thus, by starting the message correction through the switch operation by the user to convert the characters in a character string into predetermined language (matrix) characters starting with the tail of the character string, the portion before the extra or missing character is displayed as a nonsense message, and the portion after the extra or missing character is displayed as a correct message. Therefore, by combining the messages before and after correction, a more correct message may be obtained.

Fifth Embodiment

Figure 14A:
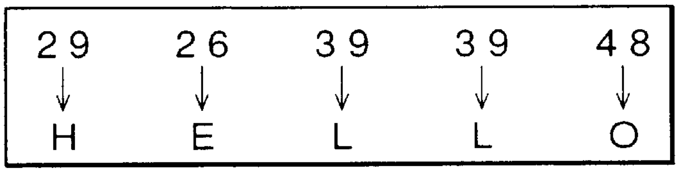
FIGS. 14(*a*)–14(*c*) illustrate inputs made by a caller according to an operation of a fifth embodiment of the present invention.
Figure 14B:
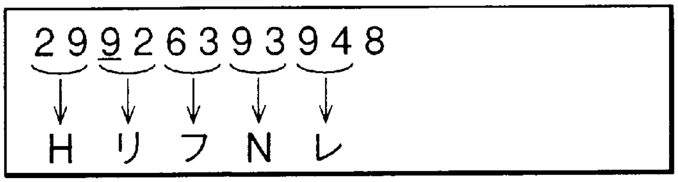
Figure 14C:
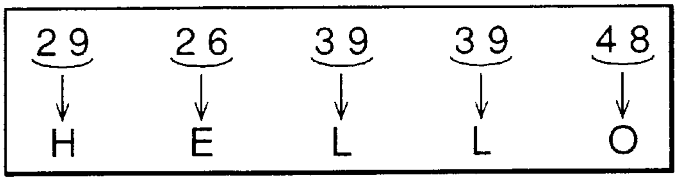

In yet another embodiment as shown in FIGS. 14(*a*)–14(*c*), assume that an operator attempts to receive a message. The message sent is meant to be "HELLO", as shown in FIG. 14(*a*).

However, there is a duplicate character included in the message (e.g., a "9"), and the message is deciphered by the receiver as shown in FIG. 14(*b*).

Accordingly, the operator judges that there is an error and activates the switch 4 to delete the second repeated character (e.g., "9") since there is an odd number (in this example and application) of characters, thereby signifying a high probability of error being present.

Thereafter, the characters are grouped to provide the message as shown in FIG. 14(*c*), and the operator confirms or "guesses" the message as "HELLO" or the like.

As another example, referring to FIGS. 12(*d*)–12(*f*), first the message is displayed as shown in FIG. 12(*e*), thereby signifying error in the message, and thus a nonsense message is displayed. Then, the operator activates the switch to obtain the message results shown in FIG. 12(*d*). The operator examines the message shown in FIG. 12(*d*) and selects a character to delete. The switch is activated by the operator to delete the selected character, and the message results shown in FIG. 12(*f*) are displayed. Thus, the operator has a high probability of "guessing" the correct message.

The embodiment of FIGS. 14(*a*)–14(*c*) can be implemented (e.g., supported) using the structure of FIGS. 2 or 4, as well as the flowcharts of FIGS. 3 or 5, and thus for brevity will not be described further herein.

An apparatus (e.g., receiver) of the present invention is not restricted to the above embodiments. For example, the radio selective-calling receiver of the third embodiment performs the second search when a nonsense message is still displayed after performing the first search. However, alternatively, the first search may be performed after completing the second search.

Moreover, the user can select the first or second search through the switch operation, or automatically select it in the CPU 6.

Furthermore, though the message correcting function of the radio selective-calling receiver of this embodiment has been described above with regard to the time of reception, the message correcting function may be applied when reading a message from the message memory 24 in the CPU 6.

Additionally, while the preferred embodiments have described the use of a matrix including kana characters, this is merely exemplary. With the invention, a caller may transmit any predetermined language/matrix characters as message information, and the message can be corrected. Thus, a message comprising any native alphabetical/user-identifiable characters to be transmitted as message information by the caller, may be corrected with the unique and unobvious structure and method of the present invention. For example, instead of a matrix including kana characters, the above embodiments are equally useful with Chinese, Hebrew, Arabic, Greek, Russian and other alphabets. Indeed, the invention would be useful with man-made or even machine-made alphabets.

Furthermore, a character conversion matrix is not restricted to that shown in FIG. 15, but other types of character conversion matrices can be used optimally. Moreover, a character conversion code is not restricted to the character conversion code of two characters shown in FIG. 11, but can be any code indicating a specific alphabet character. The invention also is capable of displaying multiple alphabets, such as kanji and kana, simultaneously. For example, the receiver of the present invention can display the characters as shown in FIG. 15 simultaneously. Thus, FIG. 15 is only an example of a character conversion matrix, and by applying another matrix (or matrices), the receiver can display multiple alphabets.

As described above, according to an apparatus (receiver) of the present invention, even if a user receives a nonsense message due to incorrect inputs by a caller, errors due to the incorrect inputs by the caller may be corrected, and a more correct message may be obtained by executing message correction through the user-operated switch.

Additionally, a display may be provided for the operator such that the first search and the second searches conducted to obtain the message, which includes first and second lines such that the operator can view the results of both searches simultaneously on the display. Thus, the first search could be positioned on the first line of the display and the second search could be positioned on the second line of the display. Such an arrangement would make it easier for the operator to view both results, thereby resulting in higher probability of obtaining a correct message.

Thus, while the invention has been described in terms of several preferred embodiments, those skilled in the art will recognize that the invention can be practiced with modification within the spirit and scope of the appended claims.

What is claimed is:

1. A receiver comprising:

a character converter for converting received data into a character string, and for converting said character string into characters, when a predetermined character in said character string is recognized by said character converter; and a message corrector for deleting a character subsequent to said predetermined character in said character string such that an incorrectly input message is corrected.

2. The receiver according to claim 1, further comprising:

a display for displaying said characters; and a receiving unit for selectively receiving said received data.

3. The receiver according to claim 1, further comprising a switch for selectively actuating said message corrector.

4. The receiver according to claim 1, wherein said message corrector includes means for converting said character string into characters when said predetermined character is not included in said data.

5. The receiver according to claim 1, wherein said message corrector includes:

a judging circuit for judging whether a number of digits in said data has a first-type value or a second-type value, said digits representing predetermined characters; and a deleting device for deleting a specified character in said character string when said number of digits in said data has said second-type value.

6. The receiver according to claim 5, wherein said first-type value comprises an even value, and said second-type value comprises an odd value.

7. The receiver according to claim 5, wherein said specified character comprises a character immediately following said predetermined character and is outside of said data, said predetermined character being a character conversion code.

8. The receiver according to claim 1, wherein said message corrector includes a detector for detecting a portion where said characters in said character string repeat, and a deleting device for deleting one character in said portion.

9. The receiver according to claim 1, further comprising:

a judging circuit for judging whether a number of digits in said data has a first-type value or a second-type value, said digits representing predetermined characters;

means for deleting a specified character in said character string when said number of digits in said data has said second value;

means for detecting a portion of said message where said characters in said character string repeat; and means for deleting one character in said portion, wherein said detecting means is operable after said judging circuit is started.

10. The receiver according to claim 9, wherein said first-type value comprises an even value, and said second-type value comprises an odd value.

11. The receiver according to claim 1, further comprising:

means for determining whether a number of digits in said data is even or odd, said digits representing predetermined characters;

means for deleting a specified character in said character string when said number of digits in said data is odd;

means for detecting a portion where said characters in said character string repeat; and means for deleting one character in said portion, wherein said determining means is operable after said detecting means is started.

12. The receiver according to claim 1, wherein said message corrector includes a first predetermined language-character conversion portion and a second predetermined language-character conversion portion.

13. The receiver according to claim 12, wherein said predetermined language-character comprises a matrix character, and wherein said first predetermined language-character conversion portion converts said character string into matrix characters starting with a beginning of said character string, and said second predetermined language-character conversion portion converts said character string into matrix characters starting with an end of said character string.

14. The receiver according to claim 1, further comprising:

a decoder for receiving an input signal and for providing received data to said character converter;

a storing section for receiving said received data; and a message processing section comprising said character converter, a predetermined language-character conversion code identifying section for receiving an output from said character converter, and a predetermined language-character conversion section for receiving an input from said predetermined language-character conversion code identifying section, wherein said message corrector comprises:

a search device for receiving an input from said predetermined language-character conversion code identifying section; and a one-character deleting section, based on an input from said search device, for deleting one character detected by said search device, and for providing an output to said predetermined language-character conversion section.

15. The receiver according to claim 14, wherein said message corrector further comprises:

a second search device for receiving an input from said predetermined language-character conversion code identifying section, for detecting whether adjacent characters in said character string repeat, said one-character deleting section deleting one character of adjacent characters which repeat.

16. The receiver according to claim 1, further comprising:

a message processing section comprising said character converter, a predetermined language-character conversion code identifying section for receiving an output from said character converter, and a predetermined language-character conversion section for receiving an input from said predetermined language-character conversion code identifying section, wherein said message corrector comprises:

a search device for identifying, based on an input from said predetermined language-character conversion code identifying section, whether the number of digits after a character conversion code has a first-type value or a second-type value; and a one-character deleting section for receiving an input from said search device, for deleting one of said characters when the number of digits has said second-type value, and for providing an output to said predetermined-language-character conversion section.

17. The receiver according to claim 1, further comprising:

a message processing section comprising said character converter, a predetermined language-character conversion code identifying section for receiving an output from said character converter, and a predetermined language-character conversion section for receiving an input from said predetermined language-character conversion code identifying section, wherein said message corrector comprises:

a search device for identifying, based on an input from said predetermined language-character conversion code identifying section, whether any adjacent characters repeat after a character conversion code; and a one-character deleting section, based on an input from said search device, for deleting one character of adjacent characters which repeat, and for providing an output to said predetermined-language-character conversion section.

18. The receiver according to claim 1, wherein said message corrector comprises:

a search device for receiving an input from said predetermined language-character conversion code identifying section; and a one-character deleting section, based on an input from an operator, for selectively deleting one character of said character string.

19. A receiver comprising:

a first converter for converting received message into a first display message; and a second converter for converting said received message into a second display message after deleting one character of a predetermined position of said received message, so that said second converter corrects an input error of said received message.

20. The receiver as claimed in claim 14, wherein said second converter means executes by converting said received message, starting with the end of said received message.

21. A method of correcting a received message, comprising steps of:

a first converting step of converting said received message into a first display message by a predetermined first converting means; and a second converting step of converting said received message into a second display message by a predetermined second converting means which corrects an input error of said received message, after deleting one character of a predetermined position of said received message.

22. A method as claimed in claim 21, wherein said second converting step is executed by converting said received message, starting with the end of said received message.

23. A method of correcting a received message, comprising steps of:

a first converting step of converting said received message into a first character message;

determining whether said message includes a character conversion code;

displaying directly said first character message, when said determining step determines said message does not include said character conversion code;

determining whether a message correction operation has started;

a second converting step of converting said first character message into a second character message, when it is determined that said message correction operation has started; and displaying said second character message.

24. A method of correcting a received message, comprising steps of:

a first converting step of converting said received message into a first character message;

determining whether said message includes a character conversion code;

a second converting step of converting said first character message into a second character message, when said determining step determines said message includes said character conversion code;

a first displaying step of displaying said second character message;

determining whether a message correction operation has started;

deleting one character immediately after said character conversion code such that an incorrectly input message is corrected, when it is determined that said message correction operation has started;

a third converting step of converting said first character message having had one character deleted, into a second character message; and a second displaying step of displaying said second character message.

25. The method as in claim 24, further comprising steps of:

reconverting said second character message into said first character message, when it is determined that said message correction operation has started;

a third display step of displaying said first character message;

selecting characters to delete in said first character message;

deleting said characters;

a fourth converting step of converting said first character message deleting said characters into a second character message; and a fourth displaying step of displaying said second character message.

26. A method of correcting a received message, comprising steps of:

a first converting step of converting said received message into a first character message;

determining whether said message includes a character conversion code;

a second converting step of converting said first character message into a second character message, when said determining step determines said message includes said character conversion code;

a first displaying step of displaying said second character message;

determining whether a message correction operation has started;

deleting one character of adjacent characters of said message which repeat after said character conversion code such that an incorrectly input message is corrected, when it is determined that said message correction operation has started;

a third converting step of converting said first character message having had one character deleted, into a second character message; and a second displaying step of displaying said second character message.

27. The method as in claim 26, further comprising steps of:

reconverting said second character message into said first character message, when it is determined that said message correction operation has started;

a third displaying step of displaying said first character message;

selecting characters to delete in said first character message;

deleting said characters;

a fourth converting steps of converting said first character message deleting said characters into a second character message; and a fourth displaying step of displaying said second character message.

28. A method of correcting a received message, comprising steps of:

a first converting step of converting said received message into a first character message;

determining whether said message includes a character conversion code;

a second converting step of converting said first character message into a second character message, when said determining step determines said message includes said character conversion code;

a first displaying step of displaying said second character message;

determining whether a message correction operation has started;

deleting one character immediately after character conversion code such that an incorrectly input message is corrected, when it is determined that said message correction operation has started;

a third converting step of converting said first character message having had one character deleted, into a second character message;

a second displaying step of displaying said second character message;

determining whether a message correction operation has started;

deleting one character of adjacent characters of said message which repeat after said character conversion code, when it is determined that said message correction operation has started;

a fourth converting step of converting said first character message having had one character deleted, into a second character message; and a third displaying step of displaying said second character message.

29. The method as in claim 28, further comprising steps of:

reconverting said second character message into said first character message, when it is determined that said message correction operation has started;

a fourth displaying step of displaying said first character message;

selecting characters to delete in said first character message;

deleting said characters;

a fifth converting steps of converting said first character message deleting said characters into a second character message; and a fifth displaying step of displaying said second character message.

30. A method of correcting a received message, comprising steps of:

a first converting step of converting said received message into a first character message;

determining whether said message includes a character conversion code;

a second converting step of converting said first character message into a second character message, when said determining step determines said message includes said character conversion code;

a first displaying step of displaying said second character message;

determining whether a message correction operation has started;

a third converting step of converting said first character message into a second character message one-by-one, starting with the end of said first character message, when it is determined that said message correction operation has started; and a second displaying step of displaying said second character message, said method further comprising steps of:

reconverting said second character message into said first character message when it is determined that said message correction operation has started;

a third displaying step of displaying said first character message;

selecting characters to delete in said first character message;

deleting said characters such that an incorrectly input message is corrected;

a fourth converting steps of converting said first character message having had said characters deleted, into a second character message; and a fourth displaying step of displaying said second character message.

31. A receiver, comprising:

a character converter for converting received data into a character string, and for converting said character string into characters, when a predetermined character in said character string is recognized by said character converter; and a message corrector for correcting an incorrectly input message.

32. The receiver according to claim 31, wherein said message corrector deletes a character subsequent to said predetermined character in said character string.

33. The receiver according to claim 31, wherein said incorrectly input message comprises a message incorrectly input by a calling party.

* * * * *